(12) United States Patent
Chen et al.

(10) Patent No.: US 6,468,362 B1
(45) Date of Patent: Oct. 22, 2002

(54) METHOD AND APPARATUS FOR CLEANING/DRYING HYDROPHOBIC WAFERS

(75) Inventors: Youfel Chen, Albany; Brian J Brown, Palo Alto; Boris Fishkin, San Carlos; Fred C Redeker, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 111 days.

(21) Appl. No.: 09/644,177

(22) Filed: Aug. 23, 2000

Related U.S. Application Data (60) Provisional application No. 60/150,656, filed on Aug. 25, 1999.

(51) Int. Cl.$^7$ .................................................. B08B 3/00
(52) U.S. Cl. ............................. 134/26; 134/2; 134/17; 134/255; 134/27; 134/28; 134/30; 134/29; 134/32; 134/33
(58) Field of Search ............................ 134/2, 17, 25.5, 134/26, 27, 28, 29, 30, 31, 32, 33, 42; 438/906

(56) References Cited

U.S. PATENT DOCUMENTS

| 5,882,433 | A |   | 3/1999  | Ueno        |       |
|-----------|---|---|---------|-------------|-------|
| 6,074,935 | A |   | 6/2000  | Ramachandran |       |
| 6,152,148 | A | * | 11/2000 | George et al. | 134/2 |
| 6,277,203 | B1| * | 8/2001  | Jiang et al. | 134/2 |

FOREIGN PATENT DOCUMENTS

| WO | WO 00/14785 | 3/2000 |
|----|-------------|--------|
| WO | WO 00/18523 | 4/2000 |

* cited by examiner

*Primary Examiner*—Philip Coe
*Assistant Examiner*—M. Kornakov
(74) *Attorney, Agent, or Firm*—Dugan & Dugan (57) ABSTRACT

A method and an apparatus that uses a surfactant to clean a hydrophobic wafer is provided. In a first aspect, the method may clean and dry a wafer without applying pure DI water to the wafer. In a second aspect, the method may clean a wafer by applying pure DI water to the wafer only for a short duration of time such that the DI water application ceases prior to or as soon as a surfactant solution is rinsed from the wafer thereafter the wafer is dried. In a further aspect a hydrophobic wafer is maintained wetted with surfactant as it is transferred between cleaning apparatuses and is rinsed via diluted surfactant or via a brief DI water spray and is thereafter dried.

9 Claims, 8 Drawing Sheets

METHOD AND APPARATUS FOR CLEANING/DRYING HYDROPHOBIC WAFERS

This application claims priority from U.S. provisional application Serial No. 60/150,656, filed Aug. 25, 1999.

FIELD OF THE INVENTION

The present invention relates generally to apparatuses and methods for cleaning thin discs, such as semiconductor wafers, compact discs, glass substrates and the like. More specifically, the present invention relates to cleaning hydrophobic wafers using a surfactant containing solution.

BACKGROUND OF THE INVENTION

As semiconductor device geometries continue to decrease, the importance of ultra clean processing increases. Conventional wafer cleaning and drying methods include one or more rinsing steps either with pure deionized water or with a cleaning solution. Before cleaning, the surfaces of silicon wafers typically are converted from hydrophobic to hydrophilic because hydrophilic surfaces do not attract particles and hydrophilic surfaces help rinsing water and cleaning solution to wet the wafer's surfaces.

Conversion from a hydrophobic state to a hydrophilic state occurs for example when the surfaces of silicon wafers react with oxygen or an oxidizer to form a thin oxide layer, which passivates the surfaces of the silicon wafer (i.e., forms a passivation layer). The passivation layer is hydrophilic, and thus facilitates subsequent cleaning processes. The surfaces of low-k dielectric wafers (wafers that have a low-k dielectric formed thereon), however, do not react with oxygen or an oxidizer to form a hydrophilic passivation layer. Thus, absent treatment, low-k dielectric wafers have hydrophobic surfaces. Therefore, when aqueous cleaning solutions are applied to the surfaces of a low-k dielectric wafer, the aqueous cleaning solutions are repelled therefrom.

Hydrophobic wafers are more difficult to clean than hydrophilic silicon wafers, due to the poor wettability of aqueous cleaning solutions on hydrophobic low-k dielectric wafers. Also, the efficiency of chemical residues removal by deionized water rinsing is very low. Drying of hydrophobic wafers is even more challenging than cleaning, due to the high affinity of particle contaminants to the hydrophobic surfaces. Further, because pure DI water is typically sprayed directly onto the hydrophobic surfaces during rinsing, water marks or residues are commonly observed on the hydrophobic surfaces during drying. Such water marks and residue may cause subsequent device failure. The semiconductor industry is increasing the use of low-k dielectric wafers and, hence, much attention has been directed to improved methods for cleaning a hydrophobic wafer.

Accordingly, a need exists for an improved method and apparatus for cleaning hydrophobic wafers.

SUMMARY THE INVENTION

The present invention provides a method and an apparatus that uses a surfactant to clean a hydrophobic wafer. The inventive cleaning method comprises two main aspects. In the first aspect, the inventive cleaning method may clean a wafer by applying a surfactant without using pure DI water. In the second aspect, the inventive cleaning method may clean a wafer by applying a surfactant followed by applying pure DI water during a short rinsing step that is sufficiently short so that rinsing ceases in one aspect, before the surfactant has been completely rinsed from the wafer, thus eliminating or minimizing the contact of pure DI water with the wafer. These aspects may be performed in any conventional cleaning and drying apparatus that is appropriately programmed to perform the inventive method. For example, the inventive methods may be employed within an SRD, scrubber, or within any tank or other type system that includes spray nozzles, any of which may further include application of vapors to achieve Marangoni drying. In a third aspect of the invention, either of the methods described above is performed as a final step in a cleaning sequence that employs a plurality of cleaning apparatuses, and that further maintains a surfactant layer on the wafer during transfer between the plurality of cleaning apparatuses, and that does not contact the wafer with pure DI water prior to the final clean/dry step, if at all.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
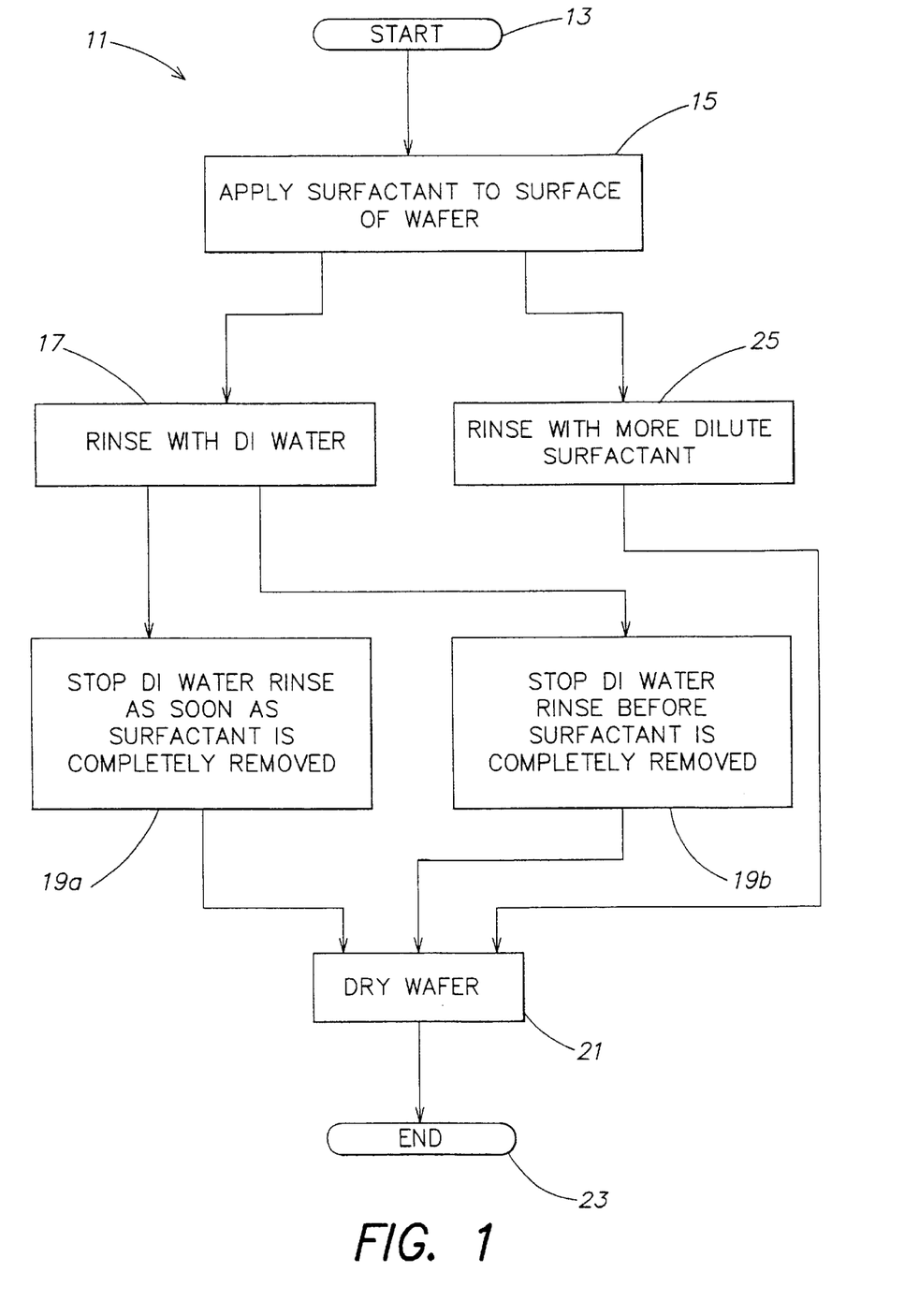
FIG. 1 is a flowchart of an inventive cleaning method that may be performed in any apparatus that may clean and dry a hydrophobic wafer.

An inventive cleaning method and apparatus that uses a surfactant to clean hydrophobic wafers (e.g., low-k dielectric wafers) is provided. FIG. 1 is a flowchart useful in describing two aspects of an inventive cleaning method 11 that may be performed in any apparatus that may clean and dry a wafer. Such apparatuses include, for example, a spin-rinse-dryer (SRD) as described further below with reference to FIG. 2, an IPA dryer that employs a fluid tank as described further below with reference to FIG. 3, an IPA dryer that employs an SRD chamber as described further below with reference to FIGS. 4A–B, a scrubber device as described further below with reference to FIG. 5, or any conventional dryer that may rinse and dry a wafer. Further aspects of the inventive cleaning method may be performed in a cleaning sequence that employs a plurality of cleaning apparatuses as described below with reference to the flow chart of FIG. 6, and the cleaning system of FIG. 7.

With reference to FIG. 1, the inventive cleaning method 11 starts at step 13. In step 15, a cleaning solution that comprises a surfactant (i.e., a surfactant containing solution)

is applied to the surfaces of a hydrophobic wafer in an apparatus that may clean and dry the hydrophobic wafer, thus forming a layer of surfactant containing solution on the wafer. In one aspect, the surfactant containing solution may comprise a WAKO NCW surfactant (e.g., NCW-601A: an aqueous solution (approximately 30 percent) of polyoxyalkylene alkylphenyl ether, NCW-1001: polyoxyalkylene alkyl ether 30 percent (w/w) aqueous solution, NCW-1002: polyoxyalkylene alky ether 10 percent (w/w) aqueous solution). The WAKO NCW surfactant may have a concentration of 0.01% to 0.1% by volume.

In a first aspect the process proceeds to step 17. In step 17, pure DI water is applied to the layer of surfactant containing solution formed on the surfaces of the hydrophobic wafer. The pure DI water is applied for a sufficiently short period of time (e.g., approximating five seconds or less) such that as the layer of surfactant containing solution is removed (step 19a) or nearly removed (step 19b), the pure DI water spray stops. Accordingly, DI water is not applied directly to the hydrophobic wafer's surface. Thus, fewer water marks may form on the surfaces of the hydrophobic wafer as the wafer is dried (step 21). Thereafter the process ends at step 23.

In a second aspect the process proceeds from step 15 to step 25. In step 25, a diluted surfactant containing solution that is more dilute than the surfactant containing solution used in step 15 is applied to the layer of surfactant containing solution formed on the surfaces of the hydrophobic wafer. In one aspect, the diluted surfactant containing solution is applied for ten seconds or less, depending on the hydrophobicity of the wafer. In the second aspect, because pure DI water is never used (only diluted surfactant containing solution is used to rinse the hydrophobic wafer), water marks may not form on the surfaces thereof as the wafer is dried (step 21). Thereafter, the process ends at step 23. For test results that employed a diluted NCW surfactant, having a concentration of less than 500 parts per million (ppm), no particle residue issue resulted. Accordingly, for wafers with higher hydrophobicity a cleaning solution of, for example, 1000 ppm may be rinsed with a more dilute cleaning solution having 500 ppm.

Figure 2:
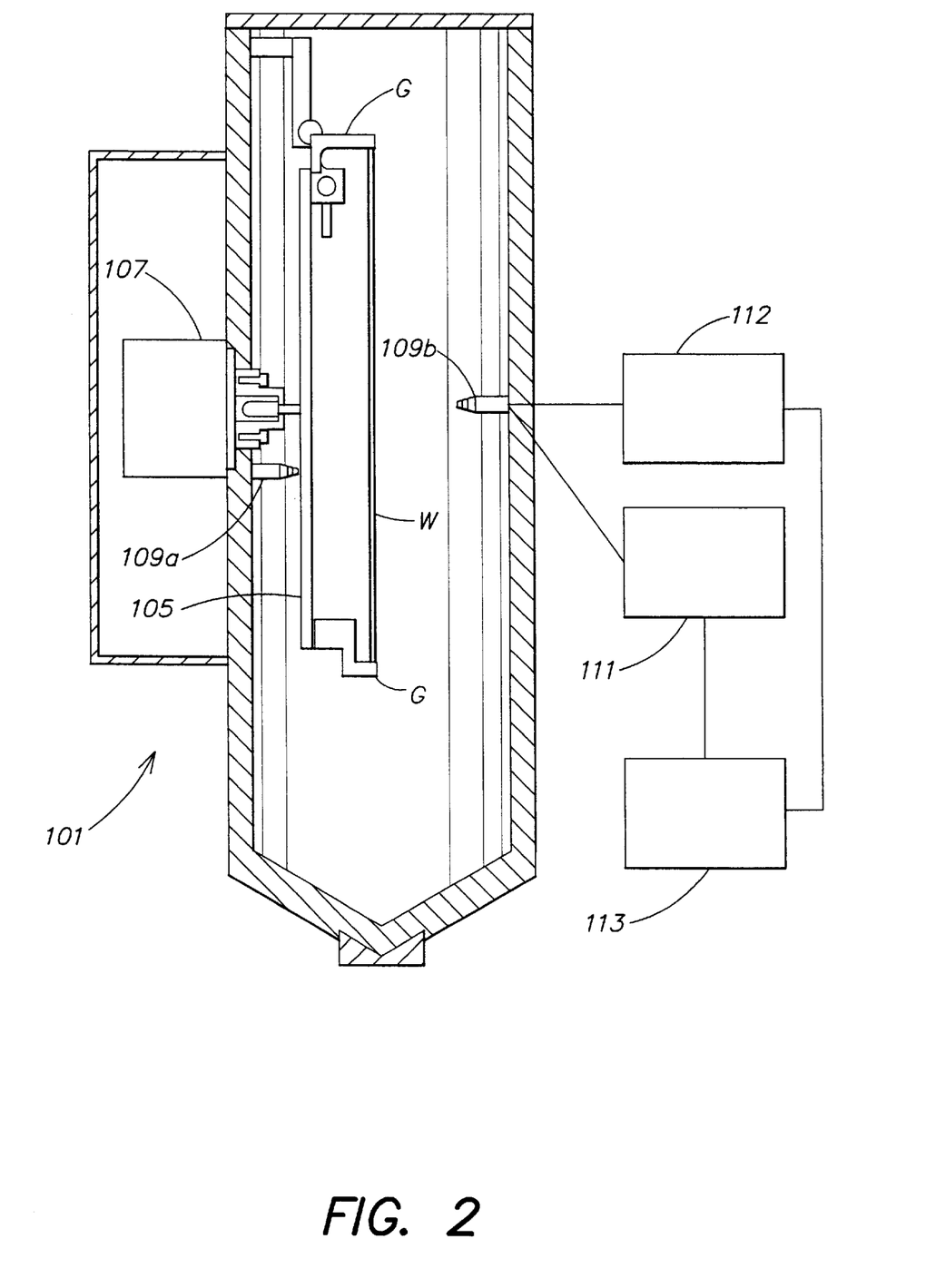
FIG. 2 is a side cross-sectional view of an SRD that may perform the inventive cleaning method.

FIG. 2 is a side cross-sectional view of an SRD 101 that may perform the inventive cleaning method 11 of FIG. 1. Within the SRD 101, a hydrophobic wafer W is shown supported by a pair of grippers G, which extend from a rotateable flywheel 105. The flywheel 105 is coupled to a motor 107 adapted to control the rotational speed of the flywheel 105.

A pair of nozzles 109a, 109b are coupled to a source of surfactant containing solution 111 and a source of rinsing fluid 112, and are positioned to supply the surfactant containing solution and the rinsing fluid to the center of the front and back surfaces of the hydrophobic wafer W, respectively. In the first aspect, the rinsing fluid may comprise pure DI water. In the second aspect, the source of rinsing fluid 112 may comprise a diluted surfactant containing solution that is more dilute than the surfactant containing solution that is contained in the source of surfactant containing solution 111.

A controller 113 is coupled to the source of surfactant containing solution and the source of rinsing fluid 111, and comprises a memory having a program stored therein adapted to automatically perform the inventive cleaning method of FIG. 1. The SRD may be configured as described in U.S. patent application Ser. No. 09/544,660, filed Apr. 6, 2000 (AMAT No. 3437/CMP/RKK) the entire disclosure of which is incorporated herein by this reference.

The operation of both aspects of the SRD 101 are described below. Regarding the first aspect, in operation, the nozzles 109a, 109b supply the surfactant containing solution to the surface of the hydrophobic wafer W as the flywheel 105 rotates, thus forming a layer of surfactant containing solution across the surface of the wafer. Thereafter, the surfactant solution spray ceases and the flywheel 105 continues to rotate while the nozzles 109a, 109b supply pure DI water to the layer of surfactant containing solution formed on the front and back surfaces of the hydrophobic wafer W. The DI water is supplied for a short period of time (e.g., approximately five seconds or less).

When the layer of surfactant containing solution formed on the hydrophobic wafer's surface is removed or nearly removed, the nozzles 109a, 109b shut off and the motor 107 either maintains or increases the rotational speed (e.g., to approximately 1000 to 2500 rpm) of the flywheel 105 such that any remaining DI water and surfactant containing solution are displaced from the hydrophobic wafer W via the rotational speed, and/or dried from the hydrophobic wafer W. Optionally, heated nitrogen also may be directed to the hydrophobic wafer W's surfaces via a nozzle (not shown) to further aid in drying the hydrophobic wafer W.

In the first aspect, because pure DI water is applied only to the layer of surfactant containing solution on the hydrophobic wafer W's surface, and is not applied directly to the hydrophobic wafer W's surface, fewer water marks may form on the surfaces of the hydrophobic wafer W.

The operation of the second aspect may comprise the same steps as the operation of the first aspect. In the second aspect, however, the nozzles 109a, 109b supply a diluted surfactant containing solution to the layer of surfactant containing solution formed on the front and the back surfaces of the hydrophobic wafer W thereby reducing the concentration of surfactant formed on the surface of the wafer W. In one aspect, depending on the hydrophobicity of the wafer, the diluted surfactant containing solution is applied for ten seconds or less.

In the second aspect, because pure DI water is never used, and only diluted surfactant containing solution is used to rinse the hydrophobic wafer W, fewer water marks may form on the surface of the wafer W.

Inventive IPA dryers that may rinse and dry a hydrophobic wafer using the inventive cleaning method are described below with reference to FIG. 3, which shows a tank module configured for Marangoni drying, and with reference to FIGS. 4A–B, which show an SRD configured for Marangoni drying.

Figure 3:
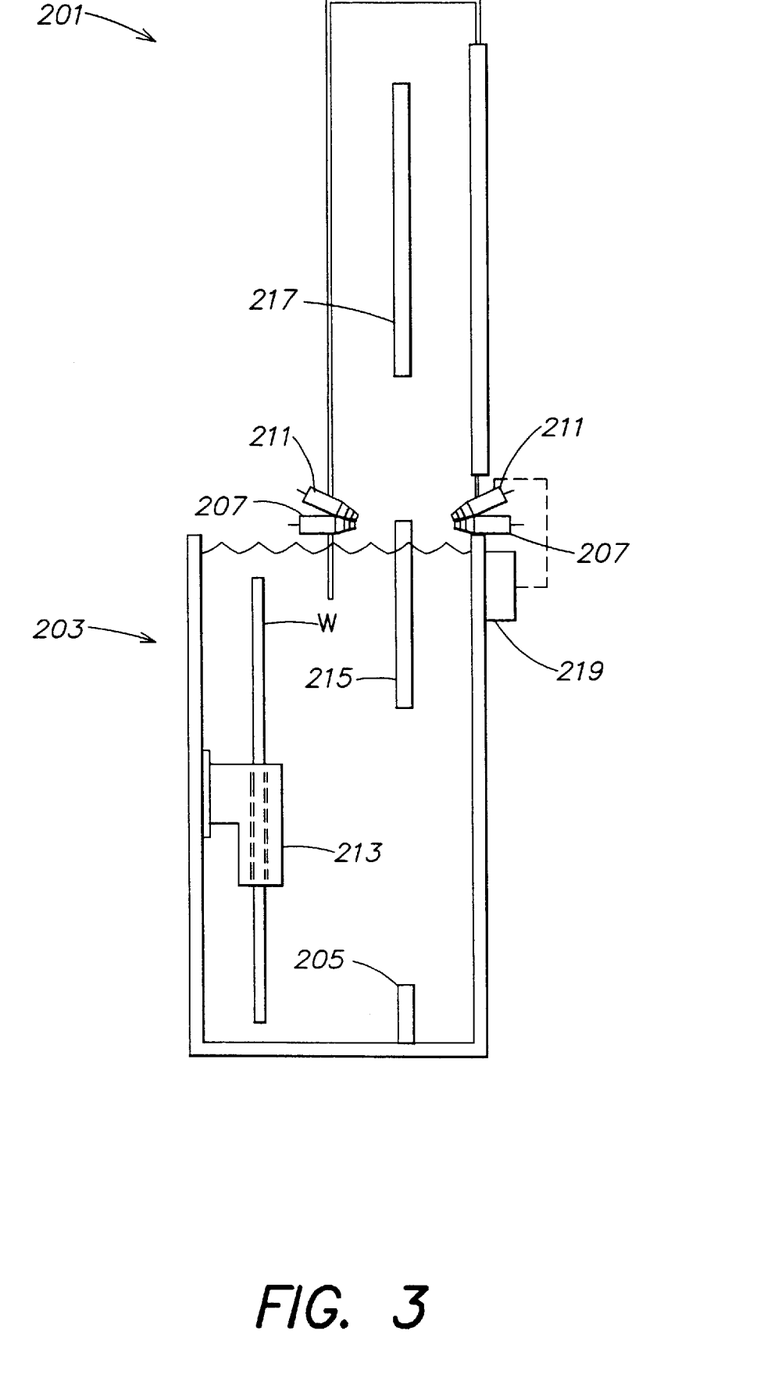
FIG. 3 is a side elevational view of an IPA dryer with a tank module that may rinse and dry a hydrophobic wafer using the inventive cleaning method.

FIG. 3 is a side elevational view of an IPA dryer 201 that employs a tank 203 and that may rinse and dry a hydrophobic wafer using the inventive cleaning method. The tank 203 is filled with a surfactant containing solution. The IPA dryer 201 comprises a lifting mechanism 205 coupled to the tank 203 and adapted to lift wafers from the tank 203. A rinsing fluid supply comprising one or more rinsing fluid nozzles 207 is positioned to spray rinsing fluid across the entire horizontal diameter of a hydrophobic wafer W as the hydrophobic wafer W is lifted from the tank 203, and a drying vapor supply comprising one or more drying vapor nozzles 211 is positioned to flow drying vapor (e.g., IPA) across the entire horizontal diameter of the hydrophobic wafer W as the hydrophobic wafer W is lifted from the tank 203. Optionally, a wafer shuttle 213 may be positioned to transfer the hydrophobic wafer W to the lifting mechanism 205.

A first pair of rails 215 may be permanently mounted within the tank 203 and may be positioned to support the hydrophobic wafer W as the lifting mechanism 205 lifts the hydrophobic wafer W. A second pair of rails 217 may be permanently mounted above the tank 203 and may be positioned to receive the hydrophobic wafer W from the first pair of rails 215.

In a first aspect, the rinsing fluid may comprise pure DI water. In a second aspect, the rinsing fluid may comprise a diluted surfactant containing solution that is more dilute than the surfactant containing solution in the tank 203.

The rinsing fluid nozzles 207 are coupled to a controller 219, and the controller 219 comprises a memory having a program stored therein adapted to automatically perform the inventive cleaning method of FIG. 1. An exemplary IPA dryer that employs a fluid tank is disclosed in U.S. patent application Ser. No. 09/280,118, filed Mar. 26, 1999 (AMAT No. 2894/CMP/RKK), the entirety of which is incorporated herein by this reference.

The operation of both aspects of the IPA dryer 201 are described below. In the first aspect, the hydrophobic wafer W is placed in the tank 203 whereby a layer of surfactant containing solution is formed on the surfaces of the hydrophobic wafer W. The lifting mechanism 205 elevates and lifts the hydrophobic wafer W from the fluid.

As the hydrophobic wafer W reaches the top of the tank fluid, the rinsing fluid nozzles 207 are engaged and begin to spray pure DI water to the layer of surfactant containing solution that has been formed on the front and back surfaces of the hydrophobic wafer W, which creates an air/wafer/rinsing fluid interface in the form of a meniscus. As soon as the hydrophobic wafer W intersects the pure DI water sprays from the rinsing fluid nozzles 207, the drying vapor nozzles 211 are engaged and direct a drying vapor flow to the rinsing fluid meniscus M which forms on the surface of the hydrophobic wafer W. The drying vapors are absorbed by the rinsing fluid, which lowers the surface tension of the rinsing fluid and induces a Marangoni flow from the meniscus toward the bulk of the rinsing fluid. The Marangoni flow thereby dries the hydrophobic wafer W's surface. The wafer W may be lifted at a speed which does not result in the surfactant being completely rinsed from the wafer W (thereby avoiding direct contact between the DI water and the surface of the wafer W) but that is slow enough to allow sufficient IPA drying (e.g., 0.1 to 0.5 inches/sec.). Heated nitrogen may be directed to the hydrophobic wafer W's surfaces via a nozzle (not shown) to further aid the drying of the hydrophobic wafer W.

In the first aspect, because pure DI water is applied only to the layer of diluted surfactant containing solution on the hydrophobic wafer W's surface, and is not applied directly to the hydrophobic wafer W's surface, fewer water marks may form on the surfaces of the hydrophobic wafer W.

The operation of the second aspect may comprise the same steps as the operation of the first aspect. In the operation of the second aspect, however, the rinsing fluid nozzles 207 supply a diluted surfactant containing solution to the front and the back surfaces of the hydrophobic wafer W.

In the second aspect, because pure DI water is never used, and only diluted surfactant containing solution is used to rinse the hydrophobic wafer W, water marks may not form on the surfaces thereof.

Figure 4A:
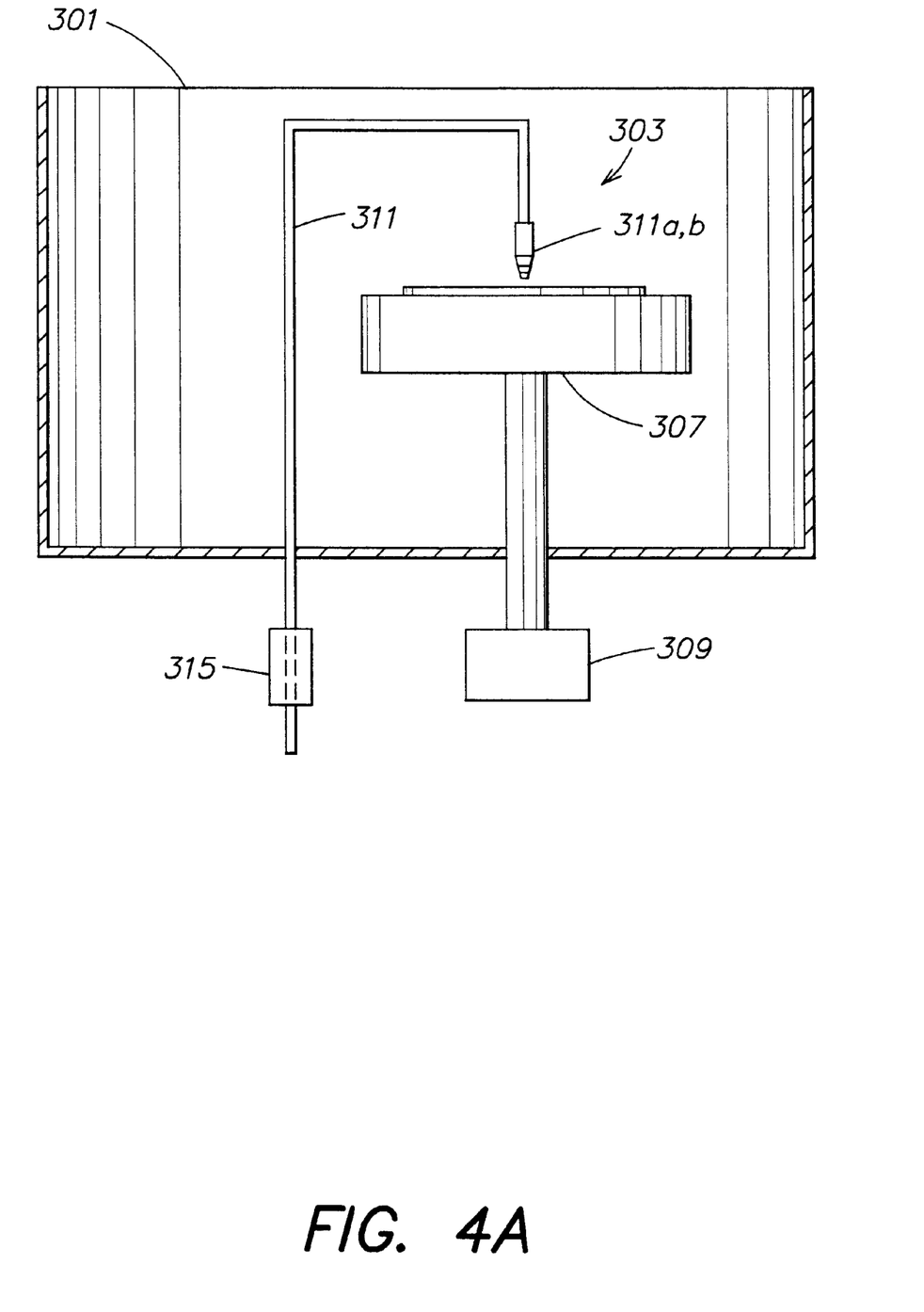
FIG. 4A is a partially sectional side view of an inventive IPA dryer with an SRD chamber that may rinse and dry a hydrophobic wafer using the inventive cleaning method.
Figure 4B:
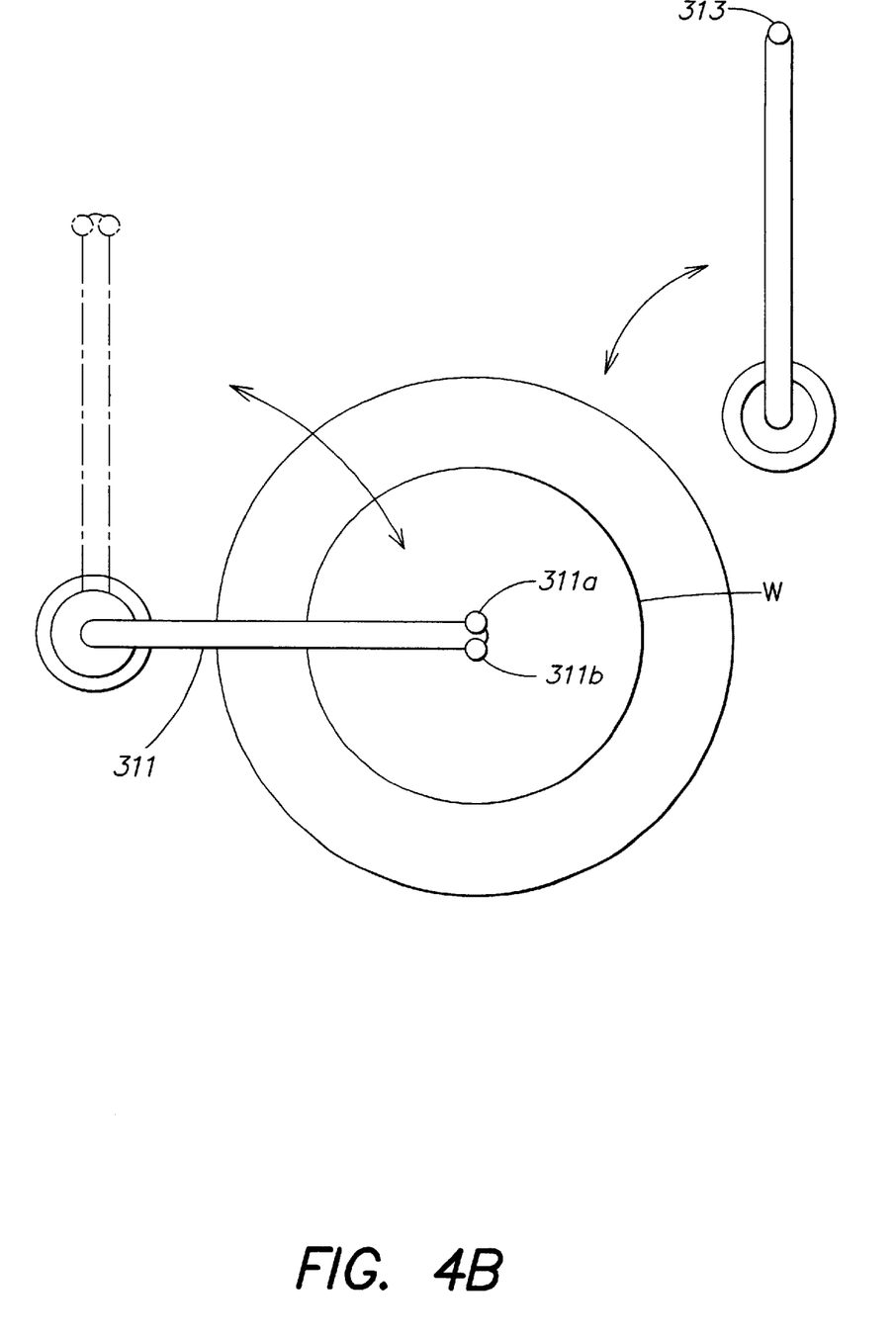
FIG. 4B is a top plan view of the IPA dryer of FIG. 4A.

FIG. 4A is a partially sectional side view of an IPA dryer 301 that employs an SRD 303 and that may rinse and dry a hydrophobic wafer W using the inventive cleaning method of FIG. 1. FIG. 4B is a top plan view of the IPA dryer 301 of FIG. 4A.

Within the IPA dryer 301, the hydrophobic wafer W is shown supported on a spin chuck 307. The spin chuck 307 is coupled to a motor 309 adapted to rotate the spin chuck 307 about a vertical axis.

A supply comprising nozzles 311a, 311b is positioned to spray a surfactant containing solution and rinsing fluid, respectively across the surface of the hydrophobic wafer W, and an organic solvent supply comprising an IPA nozzle 313 (FIG. 4B) is positioned to flow IPA liquid across the surface of the hydrophobic wafer W. In the first aspect, the rinsing fluid may comprise pure DI water. In the second aspect, the rinsing fluid may comprise a diluted surfactant containing solution.

The nozzles 311a, 311b and/or the IPA nozzle 313 are coupled to a controller 315, and the controller 315 comprises a memory having a program stored therein adapted to automatically perform the inventive cleaning method of FIG. 1.

The operation of both aspects of the IPA dryer 301 are described below. In the first aspect, the nozzle 311a supplies the surfactant containing solution to the surface of the hydrophobic wafer W, thus forming a layer of surfactant containing solution thereon while the chuck 307 rotates. Thereafter, the surfactant spray ceases and the spin chuck 307 continues to rotate at a slow speed (e.g., 300 rpm) while the nozzle 311b sprays pure DI water to the layer of surfactant containing solution formed on the surface of the hydrophobic wafer W. The DI water spray continues for a short time (e.g., approximately five seconds or less). Then, the nozzle 311b shuts off and the IPA nozzle 313 sprays IPA liquid to the surface of the hydrophobic wafer W. Each of the nozzles may begin in a position that sprays the center of the wafer and may then scan radially across the wafer to the wafer's edge as the wafer rotates.

The IPA liquid lowers the surface tension of the rinsing fluid, which allows the rinsing water to be easily removed from the surface of the hydrophobic wafer W. Thereafter, the motor 309 either maintains or increases the rotational speed of the spin chuck 307 (e.g., to approximately 1000 to 2500 rpm) such that any remaining DI water, IPA liquid, and surfactant containing solution is displaced from the hydrophobic wafer W via the rotational speed, and/or dried from the hydrophobic wafer W.

In the first aspect, because pure DI water is applied only to the layer of surfactant containing solution formed on the hydrophobic wafer W's surface, and is not applied directly to the hydrophobic wafer W's surface, fewer water marks may form on the surfaces of the hydrophobic wafer W. Also, as described above, the IPA liquid may rapidly remove the pure DI water from the surface of the hydrophobic wafer 305.

The second aspect may comprise the same steps as the first aspect. In the second aspect, however, the nozzle 311b supplies a diluted surfactant containing solution to the layer of surfactant containing solution on the surface of the hydrophobic wafer W (in one aspect, for a short period of time, approximately ten seconds or less). Because pure DI water is never used, and only diluted surfactant containing solution is used to rinse the hydrophobic wafer W, water marks may not form on the surfaces thereof.

Figure 5:
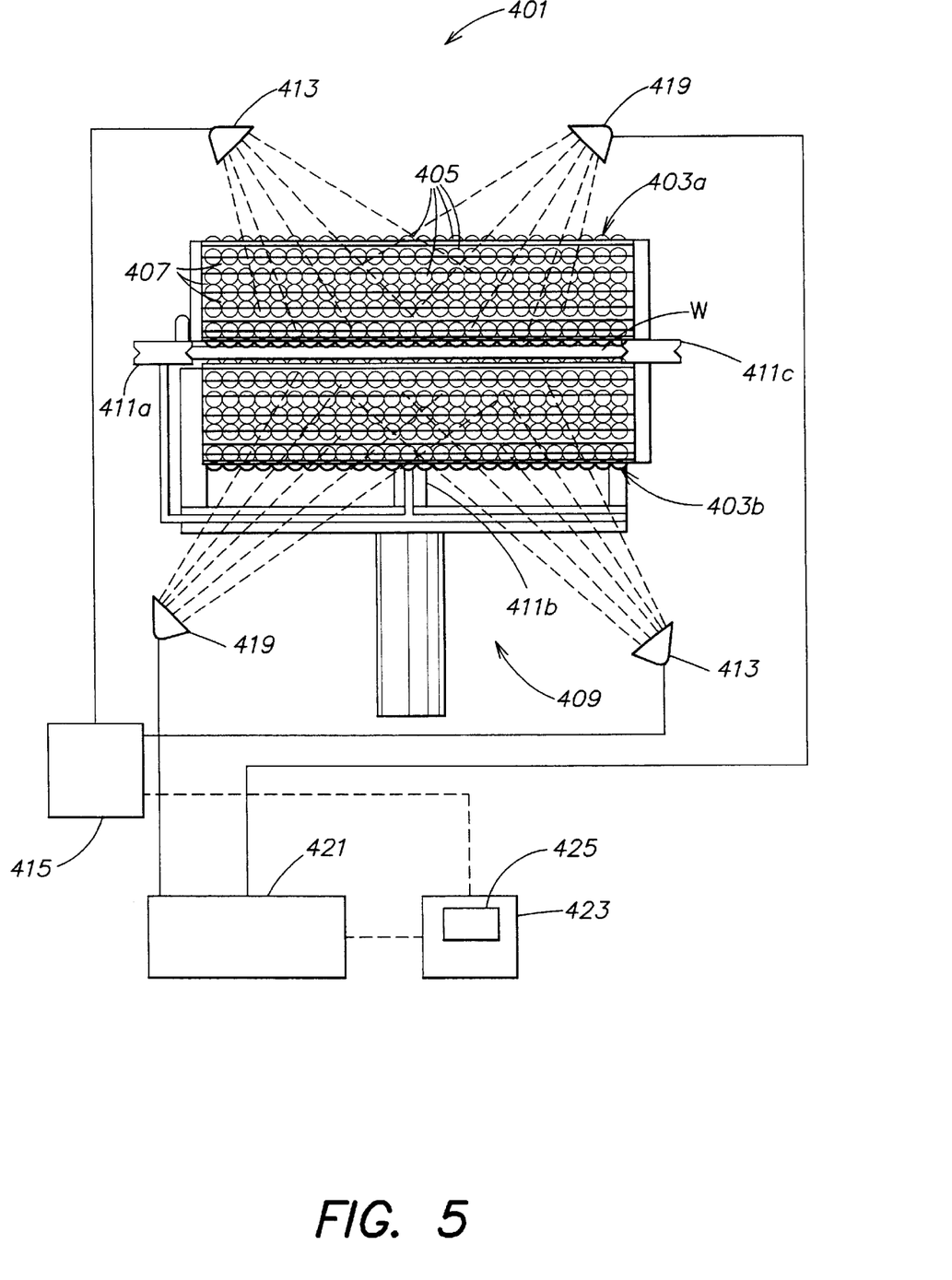
FIG. 5 is a side perspective view of a scrubber that may perform the inventive cleaning method.

FIG. 5 is a side perspective view of an inventive scrubber 401 that may perform the inventive cleaning method of FIG. 1. The inventive scrubber 401 comprises a pair of PVA brushes 403a, 403b. Each brush may comprise a plurality of raised nodules 405 across the surface thereof, and a plurality of valleys 407 located among the nodules 405. The inventive scrubber 401 also may comprise a platform 409 adapted to support a hydrophobic wafer W and a mechanism (not shown) adapted to rotate the pair of PVA brushes 403a, 403b. The platform 409 comprises a plurality of spinning mechanisms 411a–c adapted to spin the hydrophobic wafer W.

As further shown in FIG. 5, a plurality of spray nozzles 413 coupled to a source of surfactant containing solution 415 are positioned to spray the surfactant containing solution at the surfaces of the hydrophobic wafer W during wafer scrubbing. A rinsing fluid nozzle 419 is coupled to a source of rinsing fluid 421, and is positioned to spray rinsing fluid at the surfaces of the hydrophobic wafer W either after wafer scrubbing or during the final portion of wafer scrubbing when the brushes are not in contact with the wafer. In the first aspect, the source of rinsing fluid may comprise pure DI water. In the second aspect the source of rinsing fluid 421 may comprise a diluted surfactant containing solution that is more dilute than the surfactant containing solution contained in the source of surfactant containing solution 415.

A controller 423 is coupled to both sources 415, 421, and contains a program 425 adapted to control the supply of surfactant containing solution and the supply of rinsing fluid delivered to the surfaces of the hydrophobic wafer W. The controller 423 may also be coupled to the pair of PVA brushes 403a, 403b. The program 425 controls the scrubber 401 so as to operate as described below. The inventive scrubber 401 may be configured as described in U.S. patent application Ser. No. 09/191,061, filed Nov. 11, 1998 titled "METHOD AND APPARATUS FOR CLEANING THE EDGE OF A THIN DISC", the entire disclosure of which is incorporated herein by this reference.

The operation of both aspects of the inventive scrubber 401 are described below. In the first aspect, the PVA brushes 403a, 403b are initially in an open position (not shown), a sufficient distance from each other so as to allow a hydrophobic wafer W to be inserted therebetween. Thereafter, the hydrophobic wafer W to be cleaned is positioned between the PVA brushes 403a, 403b and the brushes assume a closed position, sufficiently close to each other so as to both hold the hydrophobic wafer W in place therebetween and to exert a force on the wafer surfaces sufficient to achieve effective cleaning. Mechanisms (not shown) adapted to move the brushes 403a, 403b between the open and closed positions are well known in the art and are therefore not further described herein.

Once the brushes 403a, 403b are in the closed position, a spinning mechanism (not shown) is engaged and the brushes 403a, 403b begin to spin. In one aspect, the brushes 403a, 403b spin in opposite directions applying forces to the hydrophobic wafer W in a first direction (e.g., into the page) while the hydrophobic wafer W is rotated either clockwise or counterclockwise via the spinning mechanisms 411a–c.

The front and back surfaces of the wafer W are cleaned of slurry residue or other particles when contacted by the nodules 405 of the brushes 403a, 403b, respectively. As the brushes 403a, 403b rotate, the hydrophobic wafer W is cleaned with the surfactant containing solution, which is sprayed on the front and back surfaces of the hydrophobic wafer W via the spray nozzles 413, thus forming a layer of surfactant containing solution thereon. After the hydrophobic wafer W is sufficiently scrubbed, the brushes 403a, 405b may assume the open position while the spinning mechanism continues to rotate the hydrophobic wafer W at a slow speed (e.g., 50 rpm). The rinsing fluid nozzle 419 sprays pure DI water for a short period of time (e.g., approximately five seconds or less) to the layer of surfactant containing solution formed on the front and back surfaces of the hydrophobic wafer W. After the rinsing step, hot nitrogen gas may be directed onto the wafer surfaces to dry the hydrophobic wafer W while the wafer W rotates. Alternatively a rinsing fluid nozzle and an IPA nozzle may scan radially from the center to the edge of the wafer, as the wafer rotates. Because pure DI water is applied only to the layer of surfactant containing solution on the hydrophobic wafer W's surface, and is not applied directly to the hydrophobic wafer W's surface, fewer water marks may form on the surfaces of the hydrophobic wafer W.

The second aspect of operation may comprise the same steps as the first aspect of operation. In the second aspect, however, the rinsing fluid nozzle 419 supplies a diluted surfactant containing solution to the front and the back surfaces of the hydrophobic wafer W (in one aspect, for a short period of time, such as approximately ten seconds or less).

In the second aspect, because pure DI water is never used, and only diluted surfactant containing solution is used to rinse the hydrophobic wafer W, water marks may not form on the surfaces thereof.

As previously stated, other aspects of the invention comprise a cleaning sequence that is performed within a plurality of apparatuses, as described with reference to FIGS. 6 and 7.

Figure 6:
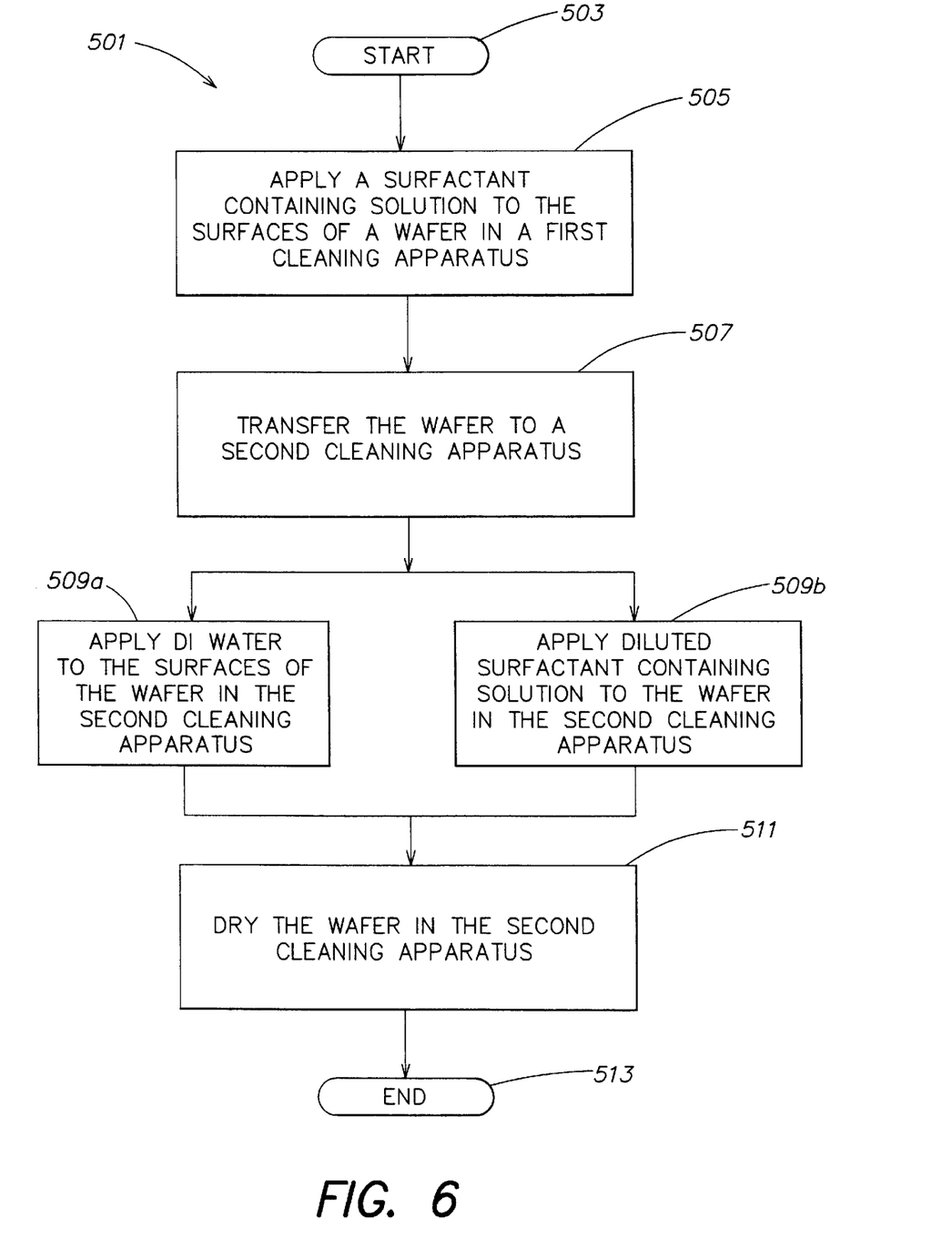
FIG. 6 is a flowchart of an inventive cleaning method that may be performed in a cleaning sequence that employs a plurality of cleaning apparatuses.

FIG. 6 is a flowchart of an inventive cleaning method 501 that may be performed in any conventional cleaning system. The inventive cleaning method 501 starts at step 503.

In step 505, a surfactant containing solution is applied to the surfaces of a hydrophobic wafer in a first cleaning apparatus so as to form a layer of surfactant containing solution thereon, which helps a cleaning solution wet the hydrophobic wafer's surfaces as described further below. The surfactant molecules may comprise a hydrophilic head portion and a hydrophobic tail portion. The hydrophobic portion may attach the surfactant molecule to the hydrophobic surface of the wafer. The hydrophilic end may attach to the cleaning solution, which enables a cleaning solution to wet the hydrophobic surface of the wafer. For example, the first cleaning apparatus may comprise a megasonic cleaner as described below with reference to FIG. 6 and/or the inventive scrubber 401 as described above with reference to FIG. 4, etc.

Then, the hydrophobic wafer having the layer of surfactant containing solution thereon is transferred to a second cleaning apparatus in step 507. The transfer occurs quickly enough so that the hydrophobic wafer maintains the layer of surfactant containing solution thereon as it transfers to the second cleaning apparatus. Because the layer of the surfactant containing solution that has formed on the hydrophobic wafer's surfaces may dry more slowly than pure DI water (and because the transfer occurs sufficiently quick) the hydrophobic wafer's surfaces remain wet as the wafer is transferred from the first cleaning apparatus to the second cleaning apparatus, which may reduce the affinity of particle contaminants to the hydrophobic surfaces.

The second cleaning apparatus may comprise the SRD 101 as described above with reference to FIG. 2, the IPA dryer 201 as described above with reference to FIG. 3, the IPA dryer 301 as described above with reference to FIG. 4, the inventive scrubber 401 as described above with reference to FIG. 5, or any rinsing and drying apparatus that may rinse and dry a wafer in accordance with the method of FIG. 1.

In step 509a, 509b, in the second cleaning apparatus, a rinsing fluid is applied to the surface of the hydrophobic wafer, having the layer of surfactant containing solution formed thereon, for a short time. In a first aspect (step 509a) the rinsing fluid is DI water and is applied for a sufficiently short period of time such that as the layer of surfactant containing solution formed on the hydrophobic wafer's surface is removed or nearly removed, the DI water spray stops. Accordingly, DI water is not applied directly to the hydrophobic wafer's surface. Test results show that a DI water rinse applied with 15–20 psi at a flow rate of 500 ml/minute will either remove or will nearly have removed a surfactant layer from a 300 mm wafer after a short time (e.g., approximately five seconds).

In a second aspect (step 509b), a diluted surfactant containing solution that is more dilute than the surfactant containing solution used in step 505 is applied to the wafer W. The dilution of the surfactant containing solution may increase over time.

Thereafter, in step 511, while still in the second cleaning apparatus, the hydrophobic wafer is dried (e.g., by spinning or through application of IPA, as described with reference to FIGS. 3–4B). In step 513 the inventive process ends.

Figure 7:
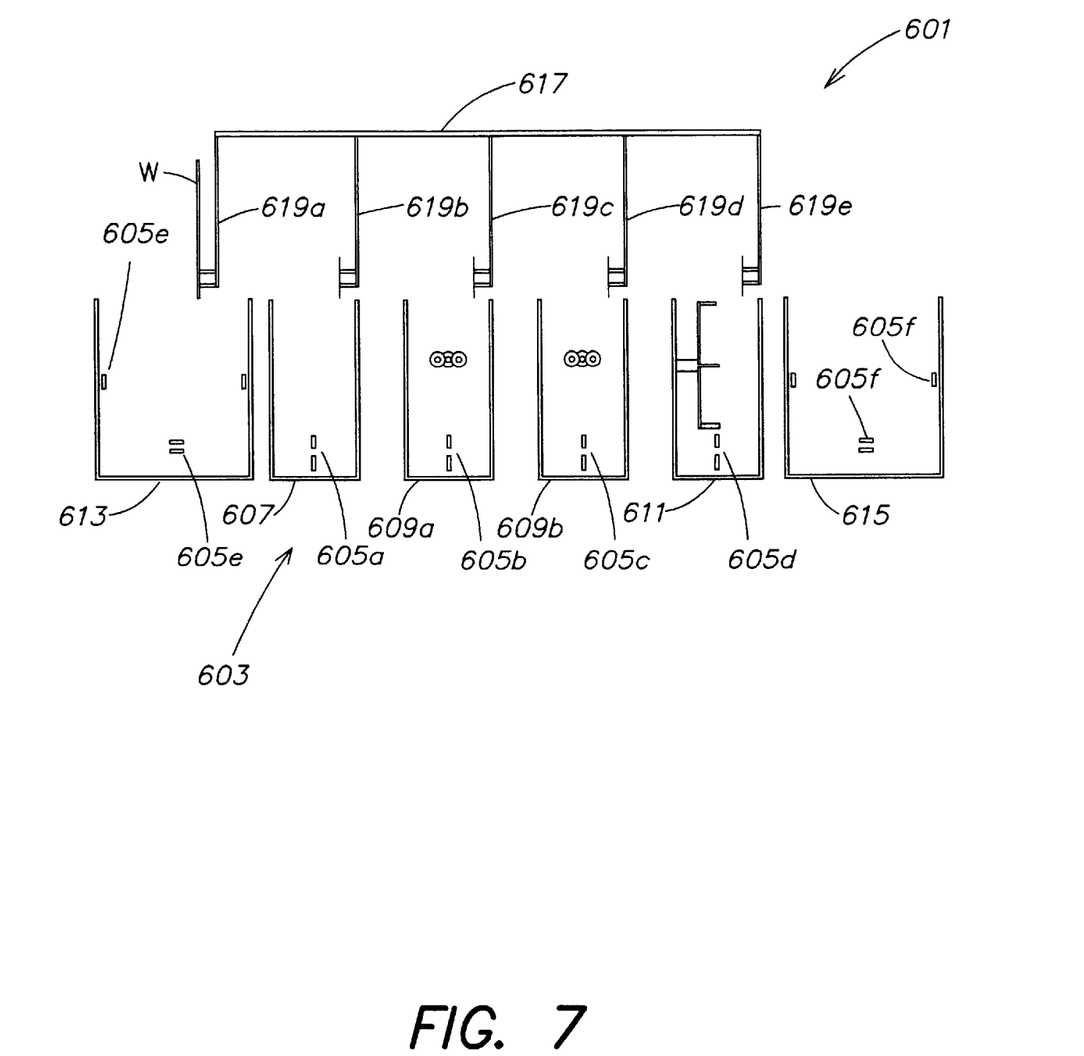
FIG. 7 is a schematic side elevational view of a cleaner that may employ the inventive cleaning method of FIG. 6.

FIG. 7 is a schematic side elevational view of an integrated cleaner 601 (e.g., having a mechanism for transferring wafers directly from one cleaning apparatus to the next) that may employ the inventive cleaning method 501 of FIG. 6. After a hydrophobic wafer W is polished by a polisher (not shown), the hydrophobic wafer W may enter the cleaner 601 to be cleaned and dried. The cleaner 601 may comprise a plurality of cleaning modules 603, each cleaning module 603 having a wafer support 605a–d that may support a vertically oriented wafer W. The cleaning modules 603 may include a megasonic cleaner module 607, a pair of scrubber modules 609a–b, and a spin-rinse-dryer module 611. The cleaner 601 also may optionally comprise an input module 613 and an output module 615. Both the input module 613 and the output module 615 may have a wafer support 605e, 605f, respectively, that supports a wafer in a horizontal orientation.

A wafer transfer mechanism 617, having a plurality of wafer handlers 619a–e, may be movably coupled above the modules 607–615. The wafer handlers 619a–e may be positioned to selectively place and extract a wafer to and from the wafer supports 605a–f upon actuation of the wafer transfer mechanism 617. The wafer transfer mechanism 617 may be adapted to lift, lower, and to index horizontally forward and backward so as to transfer wafers between the input module 613, the cleaning modules 603, and the output module 615. Specifically, the wafer transfer mechanism 617 may comprise an overhead walking beam-type robot, and the cleaner 601 may be configured as described in U.S. patent application Ser. No. 09/558,815, filed Apr. 26, 2000 titled "SEMICONDUCTOR SUBSTRATE CLEANING SYSTEM" the entire disclosure of which is incorporated herein by this reference.

In operation, a horizontally oriented hydrophobic wafer W may be loaded onto the wafer support 605e of the input module 613. While re-orienting the wafer W, the first wafer handler 619a may elevate upon actuation of the wafer transfer mechanism 617, thereby extracting the wafer W from the input module 613, and may index (i.e., move horizontally) to position the wafer W above the megasonic cleaner module 607. Thereafter, the first wafer handler 619a may lower the vertically oriented wafer W into the megasonic cleaner module 607 and may place the wafer W on the wafer support 605a. The wafer W may then be megasonically cleaned with a surfactant containing solution bath.

After the vertically oriented wafer W is megasonically cleaned in the surfactant containing solution bath, the second wafer handler 619b may extract the wafer W and quickly transfer the wafer W to the first scrubber module 609a for scrubbing. Thereafter, the third substrate handler 619c may quickly transfer the wafer W to the second scrubber module 609b for scrubbing. Within the scrubber modules 609a–b, a surfactant containing solution may be applied to the wafer W while the scrubber brushes scrub the surface of the wafer W.

After cleaning within the scrubber modules 609a–b is complete, the fourth substrate handler 619d may extract the wafer W, having the layer of surfactant containing solution thereon, and may transfer the wafer W to the spin-rinse-dryer module 611. Within the spin-rinse-dryer module 611, the wafer W may be rotated at high speed (e.g., 900 RPM) while either pure DI water (for a short period of time only) or a diluted surfactant containing solution is sprayed on the layer of surfactant containing solution that is formed on the wafer W . After the wafer W is sufficiently rinsed (as described above with reference to FIG. 1), the wafer W is spin-dried.

The fifth wafer handler 619e may then extract the vertically oriented wafer W from the spin-rinse-dryer module 611, horizontally orient the wafer W, and place the wafer W on the horizontal wafer support 605f of the output module 615. Thereafter, the wafer W may be extracted from the cleaner 601 by a wafer handler.

Because throughout the cleaning an drying process, the solutions that directly touch the surfaces of the hydrophobic wafer W are surfactant containing solutions, the hydrophobic wafer W may be effectively cleaned, rinsed, and dried with minimal water marks.

The foregoing description discloses only the preferred embodiments of the invention, modifications of the above-disclosed apparatus and method which fall within the scope of the invention will be readily apparent to those of ordinary skill in the art. For instance, the invention can be performed within any conventional scrubber (whether employing one or more roller brushes or one or more disk shaped brushes and/or any conventional spin rinse dryer or IPA dryer can be adapted to perform the present invention. Although a vertical orientation may be employed, the invention may also be performed on wafers having other orientations (e.g. horizontal). Also, when more dilute surfactant is employed as the rinsing fluid, the surfactant concentration may gradually decrease over time. In fact, in a further aspect, the invention may comprise applying a surfactant containing solution to a hydrophobic wafer and thereafter drying the hydrophobic wafer, without applying pure DI water. Accordingly, the step of applying a first more concentrated surfactant containing solution may be omitted. In an exemplary aspect, a WAKO NCW surfactant containing solution containing less than 500 ppm surfactant may be applied to a hydrophobic wafer (e.g. in any apparatus or apparatuses capable of rinsing and drying a wafer) and the wafer thereafter be dried, without applying pure DI water to the wafer.

Finally, it will be understood that as used herein wafer is not to be limited to a patterned or unpatterned semiconductor substrate but may include glass substrates, flat panel displays and the like. Also, as used herein pure DI water means deionized water that is not mixed with another substance. Thus pure DI water does not include DI water that is mixed or combined with a surfactant (whether mixed or combined prior to being applied to the wafer, or mixed or combined on the wafer's surface).

Accordingly, while the present invention has been disclosed in connection with the preferred embodiments thereof, it should be understood that other embodiments may fall within the spirit and scope of the invention, as defined by the following claims.

What is claimed is:

1. A method of cleaning a hydrophobic wafer, comprising:
   applying a first surfactant containing solution to a surface of a hydrophobic wafer in a first cleaning apparatus to thereby form a layer of surfactant on the surface of the hydrophobic wafer;
   transferring the hydrophobic wafer having the surfactant layer formed thereon to a second cleaning apparatus;
   rinsing the surface of the hydrophobic wafer with a diluted surfactant containing solution that is diluted with DI water and is more diluted than the first surfactant containing solution; and
   drying the hydrophobic wafer in the second cleaning apparatus;
   wherein DI water without surfactant is not used to rinse the hydrophobic wafer; and
   wherein transferring the hydrophobic wafer to a second cleaning apparatus comprises maintaining a layer of surfactant containing solution on the hydrophobic wafer as the hydrophobic wafer transfers to a second cleaning apparatus.

2. The method of claim 1 wherein applying a surfactant containing solution to a surface of a hydrophobic wafer in a first cleaning apparatus comprises at least partially submerging the hydrophobic wafer in a tank of fluid that contains a surfactant containing solution.

3. The method of claim 1 wherein applying a surfactant containing solution to a surface of a hydrophobic wafer in a first cleaning apparatus comprising scrubbing the hydrophobic wafer using the surfactant containing solution in a first scrubber.

4. The method of claim 1 wherein transferring the hydrophobic wafer to a second cleaning apparatus comprises transferring the hydrophobic wafer to a spin-rinse-dryer.

5. The method of claim 1 wherein the surfactant containing solution comprises a WAKO NCW surfactant.

6. The method of claim 5 wherein the WAKO NCW surfactant comprises a concentration of 0.01% to 0.1% by volume.

7. The method of claim 1 wherein rinsing the surface of a hydrophobic wafer with a diluted surfactant containing solution in a second cleaning apparatus comprises rinsing the surface of a hydrophobic wafer with a diluted surfactant containing solution in a second cleaning apparatus for 5 seconds or less.

8. The method of claim 1 wherein transferring the hydrophobic wafer to a second cleaning apparatus comprises transferring the hydrophobic wafer to an IPA dryer.

9. The method of claim 1 wherein drying the hydrophobic wafer comprises Marangoni drying the hydrophobic wafer.

* * * * *